United States Patent [19]

Sochor

[11] 4,148,537

[45] Apr. 10, 1979

[54] ZERO INSERTION FORCE CONNECTOR FOR PRINTED CIRCUIT BOARDS

[75] Inventor: Jerzy R. Sochor, Redondo Beach, Calif.

[73] Assignee: Elco Corporation, Willow Grove, Pa.

[21] Appl. No.: 866,419

[22] Filed: Jan. 3, 1978

[51] Int. Cl.[2] ........................ H01R 13/62; H05K 1/07

[52] U.S. Cl. ................................................. 339/74 R

[58] Field of Search ......... 339/74 R, 75 MP, 176 MP

[56] References Cited

U.S. PATENT DOCUMENTS 4,077,688 3/1978 Cobaugh et al. .................. 339/74 R

*Primary Examiner*—Neil Abrams

*Attorney, Agent, or Firm*—Burns, Doane, Swecker & Mathis

[57] ABSTRACT

A connector of the type including an aperture for receiving a circuit board includes a base retaining a row of longitudinally spaced contacts. The contacts include flexible portions adjacent one end. A camming bar is seated in the base for longitudinal sliding movement and for swinging movement about a longitudinal axis. A contact actuating member is mounted on the camming bar and is engageable with the contacts. The base and the camming bar include cam means responsive to longitudinal sliding movement of the camming bar for swinging the camming bar and the contact actuating member about the longitudinal axis. In this manner, the flexible portions of the contacts are displaced from the circuit board-receiving aperture to facilitate entry or removal of the circuit board. The base includes a socket within which the camming bar is seated, to form the longitudinal swinging axis of the camming bar.

18 Claims, 7 Drawing Figures

ZERO INSERTION FORCE CONNECTOR FOR PRINTED CIRCUIT BOARDS

BACKGROUND AND OBJECTS OF THE INVENTION

The present invention relates to connectors for electrically connecting one circuit board with another, and more particularly to such a connector which facilitates entry and withdrawal of the circuit boards.

Connectors for the electrical interconnection of printed circuit boards have heretofore been proposed. Traditionally, connectors of this type include a housing which forms a slot sized to receive a daughter board. A plurality of contacts are retained in the housing and include flexible ends that can be spread apart to receive the daughter board and engage the conductors thereof. Other ends of the contacts project from the housing and are adapted for connection with a mother board. In some instances the flexible ends of the contacts are forcefully spread apart upon being contacted by the daughter board. However, the cumulative resistance offered by the contacts can be difficult to overcome and may result in damage occurring to the circuit boards.

With this difficulty in mind, connectors have been proposed in which the resilient ends of the contacts can be spread apart prior to insertion or withdrawal of the daughter board. This usually involves some sort of manually actuable camming member which urges the contacts open against an inherent closing bias, or urges them closed against an inherent opening bias. Exemplary of connectors of this type are those disclosed in Hartmann U.S. Pat. No. 3,665,370 issued May 23, 1972; Lightner U.S. Pat. No. 3,848,222 issued Nov. 12, 1974; Carter U.S. Pat. No. 3,865,457, issued Feb. 11, 1975; Pritulsky U.S. Pat. No. 3,897,991 issued Aug. 5, 1975; and Yeager et al. U.S. Pat. No. 3,899,234 issued Aug. 12, 1975.

Such connectors, often referred to as zero force insertion connectors, are intended to facilitate the entry and removal of the daughter boards and minimize the strain on the circuit boards.

It is desirable that connectors of this or any other type be of minimal dimension, especially in the lateral direction, or width, to maximize the number of connectors which can be mounted to a mother board. The presence of a camming mechanism may tend to produce an excessive increase in width.

It is further important that the durability of the connector be maintained. That is, any possible fatigue-induced breakage resulting from repeatedly camming the contacts open or closed, should be avoided.

For example, in one instance a connector has been heretofore proposed as described in an article presented at the Ninth Annual Connector Symposium Proceedings held Oct. 21, 1976 at Cherry Hill, N.J., the article entitled "A new Zero-Insertion Force Card-Edge Connector" by R. Cobaugh and A. Taylor, pages 400–401, and in an AMP Brochure designated as Data Sheet Number 76-376, Revised Oct., 1976, pages 15–20 to 15–24. In this connector, inwardly-biased flexible ends of the contacts are mounted in the upper portion of a pair of side walls of the connector. The lower end of each side wall is hooked beneath the underside of a stationary base part the connector to provide a hinge about which the side wall may swing. A camming bar is slidably mounted between the base and the side wall so that when the bar is slid longitudinally, the side wall is caused to swing outwardly about its hinge, thereby spreading the contacts apart. One characteristic of this type of connector is the increased width resulting from the presence of the swinging side wall, which is located laterally outwardly of the camming bar. Furthermore, in order to remove the side walls from the base for servicing purposes, it is necessary to separate the side walls from not only the contacts, but from the hooked connection with the base.

It is, therefore, an object of the present invention to provide a novel connector for facilitating entry and removal of a circuit board.

It is another object of the invention to provide such a novel connector of relatively narrow width.

It is a further object of the invention to provide such a novel connector which is highly durable and which minimizes the effort needed to actuate the contacts.

It is an additional object of the invention to provide a novel connector which is easily disassembled for servicing.

It is still another object of the invention to provide a zero force insertion connector which employs a camming bar that is both slidably and swingably mounted to a base.

BRIEF DESCRIPTION OF INVENTION

These objects are achieved by a circuit board connector of the type including an aperture for receiving a circuit board. The connector includes a base retaining a row of longitudinally spaced contacts. The contacts include flexible portions adjacent one end. A camming bar is mounted on the base for longitudinal sliding movement and for swinging movement about a longitudinal axis. A contact actuating member is mounted on the camming bar and is engageable with the contacts. The base and the camming bar include cam means responsive to longitudinal sliding movement of the camming bar for swinging the camming bar and the contact actuating member about the longitudinal axis. In this manner, the flexible portions of the contacts are displaced away from the circuit board-receiving apertures to facilitate entry or removal of the circuit board.

The base includes a socket within which the camming bar is seated, to form the longitudinal swinging axis of the camming bar.

THE DRAWING

The advantages of the present invention will become apparent from the subsequent detailed description of a preferred embodiment thereof in connection with the accompanying drawing in which like numerals designate like elements and in which.

DETAILED DESCRIPTION OF A PREFERRED EMBODIMENT OF THE INVENTION

Figure 1:
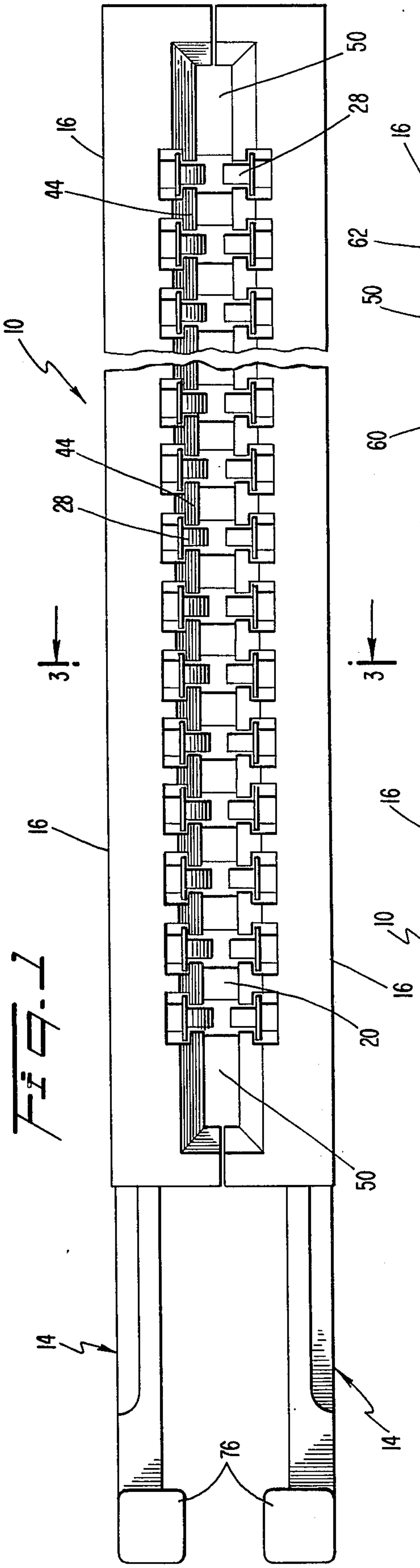
FIG. 1 is a plan view of a connector according to the present invention prior to the insertion of a daughter board.

A preferred connector 10 according to the present invention comprises a base 12, a pair of slidable camming bars 14, and a pair of contact actuating members 16.

The base 12 includes a pair of longitudinally extending inner walls 18 that are interconnected by longitudinally spaced bridge walls 20. Connected to and situated laterally outwardly of the inner walls 18 are short stub walls 22. The inner walls 18 and the sub walls 22 form open sockets 24 at each side of the base 12. These sockets are open in a direction toward the contact actuating member 16.

Retained in the base within slots 26 formed between the bridge walls 20 are a plurality of contacts 28. Each contact 28 is in mutually facing relationship with a laterally oppositely disposed contact in the slot. Each contact 28 includes, at one end, a terminal post portion 30 which projects from the base and is securable within apertures in a mother board in conventional press-fit fashion. At its other end the contact 28 includes a flexibly resilient portion 32. The flexibly resilient portion 32 is generally curvalinear in shape and includes a section 34 which is bowed toward an oppositely located contact 20 in the slot, and an enlarged head 36 which includes a pair of ears 38 extending parallel to the longitudinal axis of the base 12.

The contact actuating members 16 each comprise a longitudinally extending back wall 40, an overhang portion 42 which extends inwardly from the back wall 40, and a plurality of laterally projecting longitudinally spaced ribs 44 which form longitudinally spaced recesses 46 therebetween. Each rib 44 includes longitudinally extending flanges 48 which overlie a portion of each recess. The ribs 44 are spaced laterally of the longitudinal center plane of the base to form an aperture 50 for receiving a daughter board.

The heads 36 of the contacts 28 are received within the recesses 46 such that the ears 38 are disposed behind the flanges 48, the latter forming shoulders for engaging the ears 38.

In a normal, unflexed condition of the contacts 28 the curved resilient portions protrude into the aperture 50 beyond inner faces 52 of the ribs 44.

The camming bars 14 are seated in the base 12 and carry the contact-actuating members 16. Each camming bar 14 includes a main body portion 56 and a pair of outwardly extending legs 58, 60 projecting from an inner side thereof. The legs are coplanar and extend in opposite directions. A first of these legs 58 is seated within the sockets 24 formed by the internal wall 18 and the sub walls 22 to form a longitudinal swivel axis for the camming bar 14. The sockets are outwardly flared at 23 to enable the legs 58 to swing within the sockets without having to bend or flex to any appreciable degree. A second of the legs 60 is disposed within slots 62 (FIG. 3) formed in the ribs 44 and is situated laterally inwardly of the back wall 40 of the contact-actuating member 16.

The main body portion 18 of the camming bar 14 includes an outer surface 64 which is coplanar with outer surfaces 66, 68 of the sub wall 22 and contact-actuating member 16.

The camming bar 14 is longitudinally slidable relative to the base 12 and the contact-actuating portion 16. As will be discussed below, when such longitudinal sliding movement occurs, the resilient portions 32 of the contacts 28 are flexed laterally outwardly away from the aperture 50.

Figure 6:
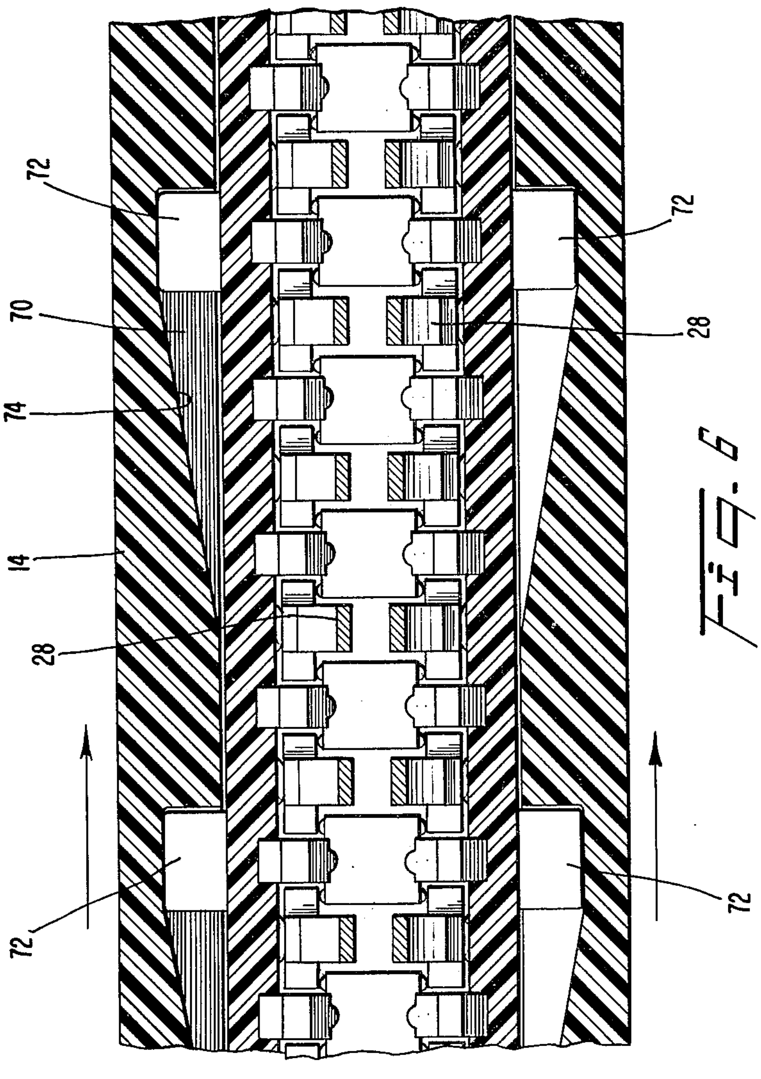
FIG. 6 is a longitudinal sectional view through the connector taken along a plane which is perpendicular to the contacts.

A plurality of longitudinally extending inwardly open cam channels 70 are formed in the main body portion 56 of each camming bar 14 (FIG. 6). These channels 70 are guided for sliding movement against respective ones of a plurality of guide blocks 72 that are carried on the backside of the internal wall 18.

Each channel 70 includes a ramp 74 which is inclined. laterally inwardly in a longitudinally inward direction.

The camming bars 14 project longitudinally from the housing and include enlarged gripping portions 76 at their outer ends, enabling the cam bars to be manually displaced longitudinally. When the camming bar 14 is slid longitudinally outwardly, the ramps 74 are displaced laterally outwardly by the blocks 72, thereby pivoting the camming bar 14 outwardly about the first leg 58. At the same time, the camming bar 14 acts against the back wall 40 of the contact actuating member 16 to displace the latter laterally outwardly. The flexible portions 32 of the contacts 28 are thus caused to flex laterally outwardly away from the aperture 50 as they are engaged by the flanges 48 of the contact-actuating members 16. Accordingly, a daughter board can be inserted into a aperture 50 with minimal effort. Once the daughter board has been inserted, the camming bars 14 are pushed longitudinally inwardly, enabling the contacts 28 to be released to their normal position and against the conductors of the daughter board.

Figure 7:
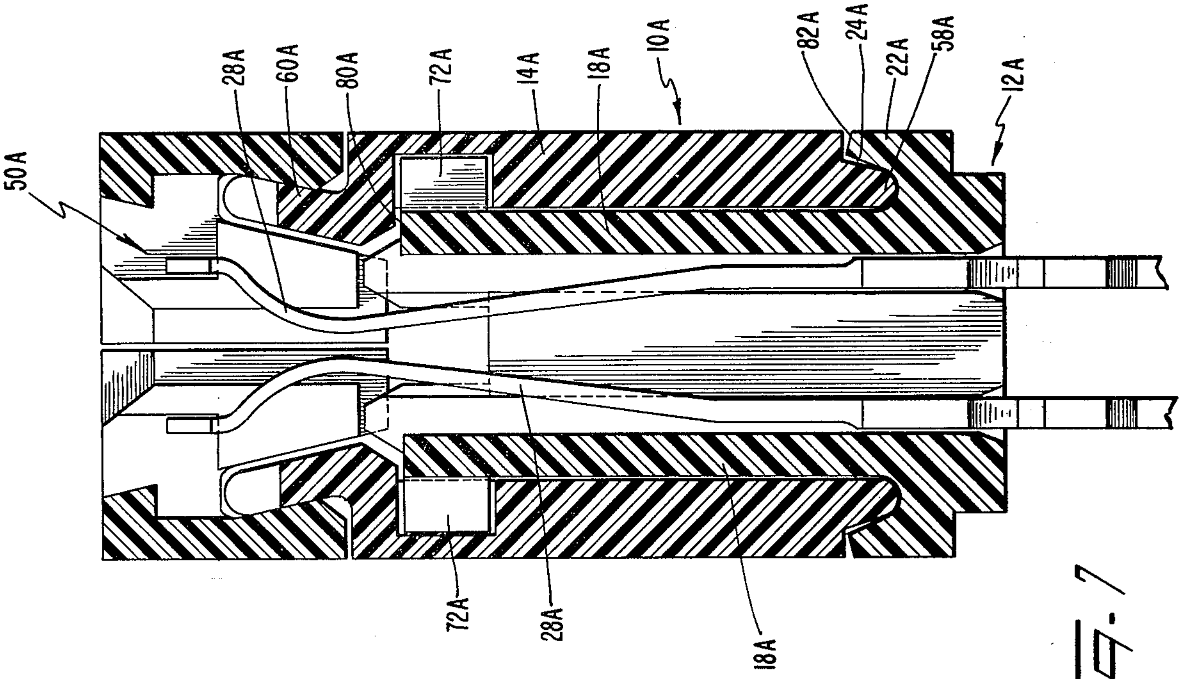
FIG. 7 is a cross-sectional view similar to FIG. 3 of a modified connector.

In FIG. 7, a modified connector 10A is disclosed which is of somewhat narrower width than that earlier described. The legs 60A of the camming bars 14A are arranged to overlie the upper surfaces 80A of the inner walls 18A of the base 12A. Each leg 60A is inclined away from the aperture 50A to accommodate outward flexing of the contacts 28A. The legs 58A are somewhat shorter than the corresponding legs 58 of the earlier described embodiment, and the outer face 82A of each sub wall 22A is beveled outwardly to facilitate swinging motion of the camming bar within the socket 24A.

Figure 3:
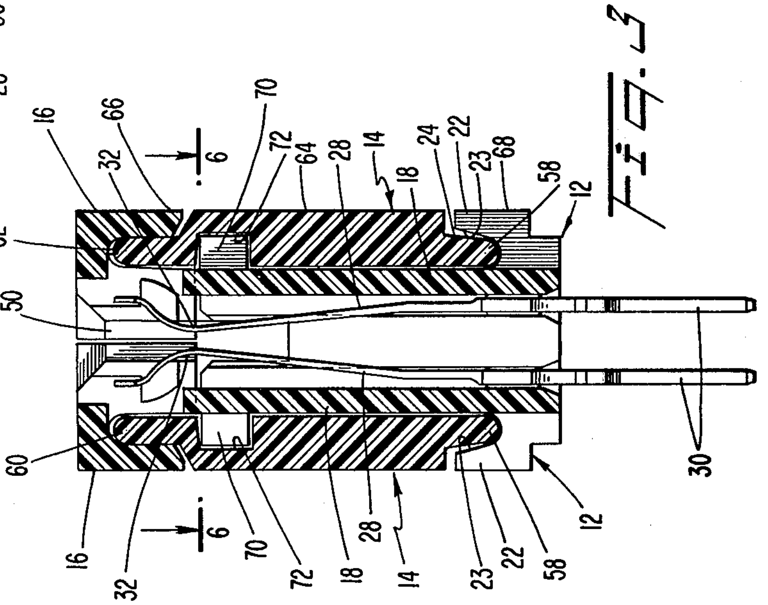
FIG. 3 is a cross-sectional view of the connector, taken along line 3–3 in FIG. 1.
Figure 2:
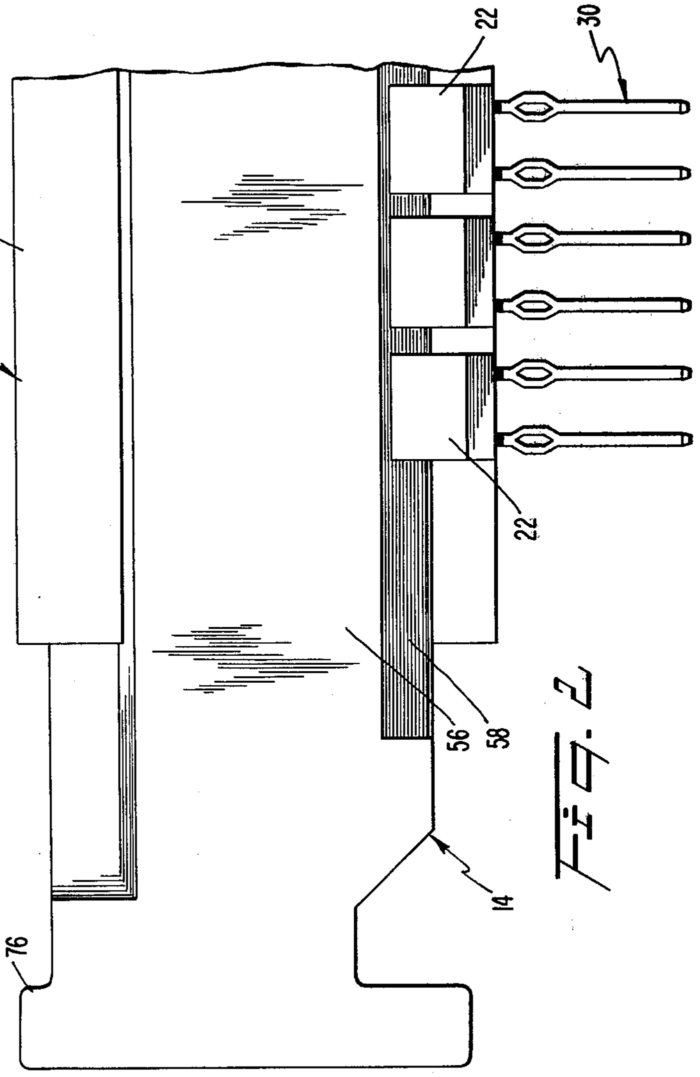
FIG. 2 is a side view of an end portion of the connector.
Figure 5:
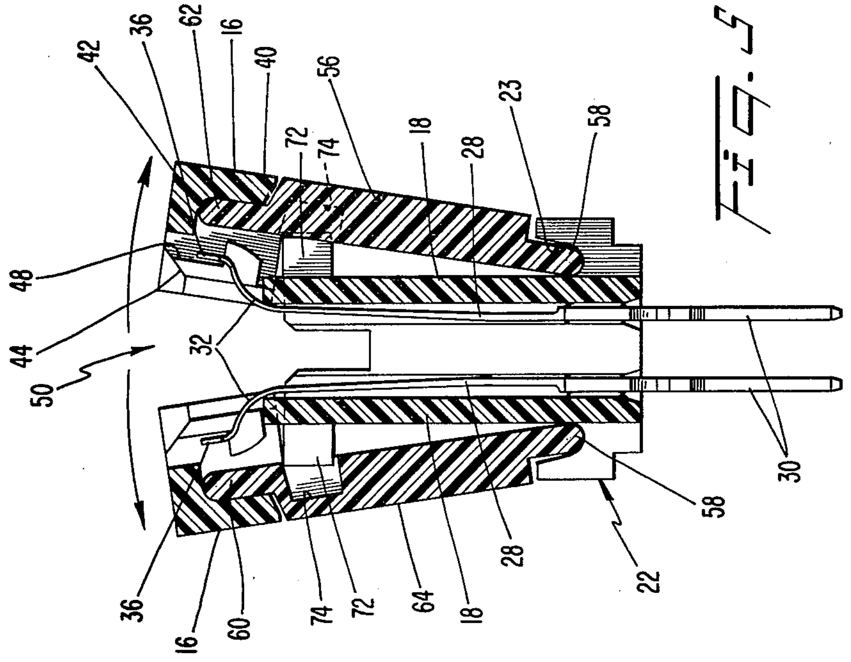
FIG. 5 is a cross-sectional view similar to FIG. 3, after the camming bars have been pulled out to spread the contacts apart.
Figure 4:
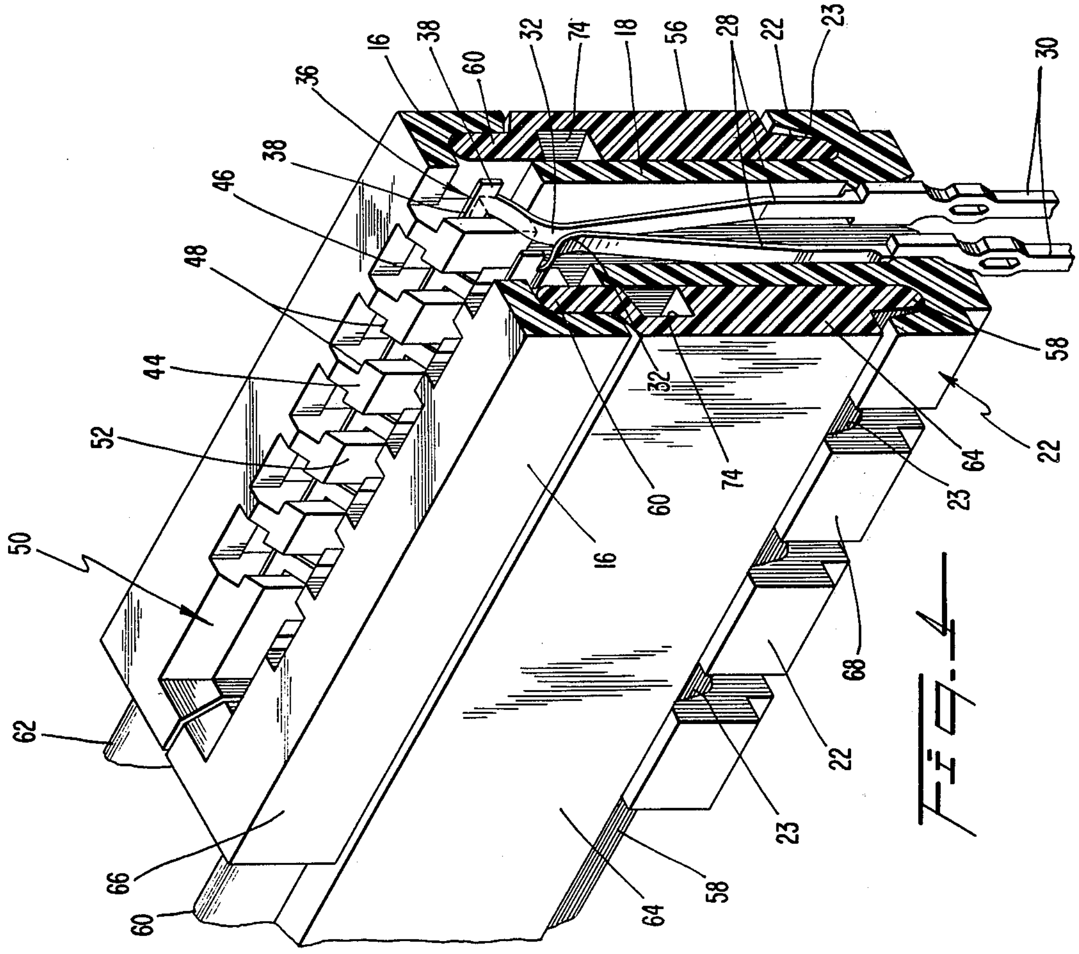
FIG. 4 is a perspective view of the connector, with a portion broken away to reveal the connector interior.

In operation, the contacts are normally disposed in an inwardly biased condition toward the aperture 50 (FIG. 3). When a daughter board is to be installed, the camming bars 14 are pulled longitudinally outwardly so that interaction between the ramps 74 and the blocks 72 causes the camming bars 14 to be swung laterally outwardly about the longitudinal axes defined by the leg-and-slot arrangements 58, 24. At the same time, each camming bar 14 displaces the contact-actuating member 16 laterally outwardly so that the contacts are flexed away from the aperture 50. Accordingly, a daughter board may be installed with minimal effort. Thereafter, the camming bars 14 are pushed longitudinally inwardly, allowing the contacts 28 to snap laterally inwardly into contact with conductors of the daughter board.

Although the illustrated connector is of the top entry type, it will be appreciated that the end of the connector could be open to permit side entry of the daughter board, as well. Also, the contacts could be of the type which are biased outwardly, rather than biased inwardly.

It will be realized that the connector 12 enables a daughter board to be inserted or removed with minimal effort. This is achieved without unduly enlarging the lateral dimension of the connector, i.e., there are no side walls located outwardly of the camming bars. Rather, the lateral dimension of the connector extends from the outer surface of one camming bar to the outer surface of the other camming bar.

Moreover, the effort required to actuate the contacts does not involve appreciable bending or flexing of the camming bar, so that such effort is minimized.

Although the invention has been described in connection with a preferred embodiment thereof, it will be appreciated by those skilled in the art that additions, modifications, substitutions and deletions not specifically described may be made without departing from the spirit and scope of the invention as defined in the appended claims.

What is claimed is:

1. A connector of the type including an aperture for receiving a circuit board, said connector comprising:

a base containing a row of longitudinally spaced contacts, said contacts including flexible portions adjacent one end;

a camming bar;

one of said camming bar and said base including socket forming means which receives the other of said camming bar and said base to mount the camming bar on said base for longitudinal sliding movement and for laterally outward and inward swinging movement about a longitudinal axis located adjacent one end of said camming bar;

a contact actuating member mounted on another end of said camming bar, said contact actuating member having one end engageable with said contacts and another end terminating short of said socket forming means;

said base and said camming bar including cam means responsive to longitudinal sliding movement of said camming bar for swining said camming bar and said contact-actuating member about said longitudinal axis so that said flexible portions of said contacts are displaced away from the aperture to facilitate entry or removal of a circuit board.

2. A connector according to claim 1, wherein said socket forming means are in said base and are being open in a direction toward said contact-actuating member; said camming bar being seated in said socket forming means to define therewith said longitudinal axis.

3. A connector according to claim 2, wherein each socket is flared laterally outwardly.

4. A connector according to claim 2, wherein said base includes an inner wall and a stub wall shorter than said inner wall and spaced laterally outwardly therefrom to define therewith said socket forming means, said camming bar including a first leg received in said socket forming means.

5. A connector according to claim 3, wherein outer surfaces of said contact-actuating member, said camming bar, and said stub wall are substantially coplanar.

6. A connector according to claim 5, wherein said camming bar includes a second leg; said contract-actuating portion including a slot receiving said second leg.

7. A connector according to claim 1, wherein said camming bar includes an inclined ramp and said base includes a cam block engageable with said ramp such that longitudinally outward sliding movement of said ramp relative to said block produces outward swinging motion of said camming bar.

8. A connector according to claim 1, wherein said flexible portions of said contacts are inherently biased toward the aperture and include longitudinally extending ears; said contact-actuating member including longitudinally spaced ribs projecting toward the aperture, with said contacts mounted therebetween; said ribs including longitudinally spaced flanges overlying said ears on said contact so that swinging movement of said camming bar flanges away from the aperture causes said flanges to displace said flexible portions against their inherent bias.

9. A connector of the type including an aperture for receiving a circuit board, said connector comprising:

a base containing a row of longitudinally spaced contacts on opposite sides of the aperture, said contacts including flexible portions adjacent one end;

said base including socket means on opposite sides thereof;

a pair of camming bars mounted on opposite sides of said base for longitudinal sliding movement relative thereto, said camming bars being seated in said socket means for swinging movement toward and away from the aperture;

a pair of contact-actuating members mounted on said camming bars, each contact-actuating member including one end receiving the flexible ends of one of said rows of contacts and another end terminating short of said socket means; and said base and said camming bars including cam means responsive to longitudinally outward sliding movement of said camming bars for swinging said camming bars and said flexible portions of said rows of contacts away from the aperture to facilitate entry of the circuit board.

10. A connector according to claim 9, wherein each socket means is flared laterally outwardly.

11. A connector according to claim 9, wherein said base includes an inner wall and a stub wall shorter than said inner wall and spaced laterally outwardly therefrom to form therewith said socket means, said camming bar including a first leg received in said socket means.

12. A connector according to claim 11, wherein outer surfaces of said contact-actuating member, said camming bar and said stub wall are substantially coplanar.

13. A connector according to claim 12, wherein said camming bar includes a second leg; said contact-actuating portion including a slot receiving said second leg.

14. A connector according to claim 9, wherein said camming bar includes an inclined ramp and said base includes a cam block engageable with said ramp such that longitudinally outward sliding movement of said ramp relative said block produces outward swinging motion of said camming bar.

15. A connector according to claim 9, wherein said flexible portions of said contacts are inherently biased toward the aperture and include longitudinally extending ears; said contact-actuating member including longitudinally spaced ribs projecting toward the aperture, with said contacts mounted therebetween; said ribs including longitudinally spaced flanges overlying said ears on said contact so that swinging movement of said camming bar causes said flanges to displace and flexible portions against their inherent bias.

16. A circuit board connector comprising:

a longitudinally elongated base, said base including a pair of laterally spaced inner walls, and stub walls disposed laterally outwardly of said inner walls to form longitudinal sockets, said inner wall carrying a plurality of cam blocks, a pair of laterally spaced rows of longitudinally spaced contacts retained by said base, said contacts each including at one end a terminal portion extending beyond said base and at another end, an inwardly biased flexible portion, a pair of camming bars mounted on opposite sides of said base, each camming bar comprising a main portion and a pair of legs extending outwardly therefrom in opposite directions, one of said legs being mounted in said socket to form a swivel axis for said camming bar, a pair of contact-actuating portions mounted on said camming bars, said contact-actuating portions being mounted on the other legs of said camming bar and including a first end having laterally inwardly extending ribs between which are disposed said flexible portions of said contacts and a second end terminating short of said sockets, each of said camming bars including:

a plurality of inclined ramps engageable with said cam blocks, so that as said camming bars are slid longitudinally relative to said base and said contact-actuating portion, said camming bars and said contact-actuating portions are swung outwardly about said swivel axis to laterally separate the flexible portions of said rows of contacts.

17. A connector of the type including an aperture for receiving a circuit board, said connector comprising:

a base containing a row of longitudinally spaced contacts, said contacts including flexible portions adjacent one end;

a camming bar including first and second ends, said camming bar mounted on said base for longitudinal sliding movement and for swinging movement about a longitudinal axis located adjacent said first end of said camming bar;

said camming bar including a laterally outermost side surface extending between said first and second ends;

a contact actuating member mounted on said second end of said camming bar, said contact actuating member having one end engageable with said contacts and another end terminating short of said first end of said camming bar;

said actuating member including a laterally outermost side surface extending laterally outwardly no farther than said outermost surface of said camming bar;

said base and said camming bar including cam means responsive to longitudinal sliding movement of said camming bar for swining said camming bar and said contact-actuating member about said longitudinal axis so that said flexible portions of said contacts are displaced away from the aperture to facilitate entry or removal of a circuit board.

18. A connector of the type including an aperture for receiving a circuit board, said connector comprising:

a base containing a row of longitudinally spaced contacts, said contacts including flexible portions adjacent one end;

a camming bar including first and second ends, said camming bar mounted on said base for longitudinal sliding movement and for swinging movement about a longitudinal axis located adjacent said first end of said camming bar;

said camming bar including a laterally outermost side surface extending between said first and second ends;

a contact actuating member mounted on said second end of said camming bar, said contact actuating member having one end engageable with said contacts and another end terminating short of said first end of said camming bar;

said actuating member including a laterally outermost side surface disposed substantially coplanar with said laterally outermost side surface of said camming bar;

said base and camming bar including cam means responsive to longitudinal sliding movement of said camming bar for swinging said camming bar and said contact-actuating member about said longitudinal axis so that said flexible portions of said contacts are displaced away from the aperture to facilitate entry or removal of a circuit board.

* * * * *